US008415995B2

(12) United States Patent
Sato

(10) Patent No.: US 8,415,995 B2
(45) Date of Patent: Apr. 9, 2013

(54) ELECTRIC CIRCUIT AND SIGNAL PROCESSING METHOD

(75) Inventor: Tomio Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 13/046,367

(22) Filed: Mar. 11, 2011

(65) Prior Publication Data

US 2011/0204933 A1 Aug. 25, 2011

Related U.S. Application Data

(63) Continuation of application No. PCT/JP2008/066595, filed on Sep. 12, 2008.

(51) Int. Cl.
*H03L 7/00* (2006.01)
(52) U.S. Cl. ......... 327/144; 327/146; 327/379; 327/387
(58) Field of Classification Search .................. 327/145, 327/144, 379, 387
See application file for complete search history.

(56) References Cited

U.S. PATENT DOCUMENTS

| 6,255,869 B1 * | 7/2001 | Fischer | 327/145 |
| 6,292,038 B1 * | 9/2001 | Stachura et al. | 327/145 |
| 6,477,143 B1 * | 11/2002 | Ginossar | 370/230 |
| 6,946,886 B2 * | 9/2005 | Isomura | 327/141 |
| 7,768,332 B2 * | 8/2010 | Tamura | 327/291 |
| 2003/0218955 A1 * | 11/2003 | Isshiki et al. | 369/59.21 |
| 2007/0121235 A1 * | 5/2007 | Sai et al. | 360/51 |

FOREIGN PATENT DOCUMENTS

| JP | 2-28707 A | 1/1990 |
| JP | 5-11558 U | 2/1993 |
| JP | 6-225185 A | 8/1994 |
| JP | 6-283999 A | 10/1994 |
| JP | 9-135213 A | 5/1997 |
| JP | 2005-27004 A | 1/2005 |
| JP | 2005-341278 | 12/2005 |

* cited by examiner

*Primary Examiner* — Ryan Jager
(74) *Attorney, Agent, or Firm* — Arent Fox LLP

(57) ABSTRACT

An electric circuit includes a first circuit, a second circuit, a synchronization detection circuit, a storage circuit, and a correction circuit. The first clock is configured to operate with a first clock, the second circuit is configured to operate with a second clock which is different in frequency from the first clock, and the synchronization detection circuit is configured to detect synchronization of the first and second clocks. The storage circuit is configured to store an output noise pattern of the second circuit, based on the synchronization detected by the synchronization detection circuit, and the correction circuit is configured to correct an output of the second circuit by using the output noise pattern.

19 Claims, 17 Drawing Sheets

US 8,415,995 B2

ELECTRIC CIRCUIT AND SIGNAL PROCESSING METHOD

CROSS-REFERENCE TO RELATED APPLICATION

This application is a continuation application and is based upon PCT/JP2008/066595, filed on Sep. 12, 2008, the entire contents of which are incorporated herein by reference.

FIELD

The embodiments discussed herein are related to an electric circuit and a signal processing method.

BACKGROUND

It is known to provide a so-called mixed analog-digital LSI circuit which is constructed, for example, by incorporating an analog/digital converter (ADC) in a logic LSI. This type of LSI circuit, however, has had the problem that the noise generated during the operation of a logic circuit in the digital circuit block may adversely affect the accuracy of the ADC in the analog circuit block.

Incidentally, in recent years, LSI circuits having a plurality of circuit blocks that operate with different clock frequencies have been increasing in number, making it increasingly difficult to address the problem by the related art circuit configuration designed to operate with the same clock frequency.

More specifically, for example, in the case of a circuit in which a clock input dedicated to the digital circuit is provided separately from the sampling clock of the ADC so that the digital circuit that may become a noise source operates asynchronously with respect to the analog circuit, it has been difficult with the related art electric circuits to sufficiently reduce the adverse effects of the noise.

Patent Document 1: Japanese Laid-open Patent Publication No. H06-283999
Patent Document 2: Japanese Laid-open Utility Model Publication No. H05-011558

SUMMARY

According to an aspect of the embodiment, an electric circuit includes a first circuit, a second circuit, a synchronization detection circuit, a storage circuit, and a correction circuit.

The first clock is configured to operate with a first clock, the second circuit is configured to operate with a second clock which is different in frequency from the first clock, and the synchronization detection circuit is configured to detect synchronization of the first and second clocks.

The storage circuit is configured to store an output noise pattern of the second circuit, based on the synchronization detected by the synchronization detection circuit, and the correction circuit is configured to correct an output of the second circuit by using the output noise pattern.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Before describing in detail the embodiments of electric circuit and a signal processing method and their associated problems will be described.

Figure 1:
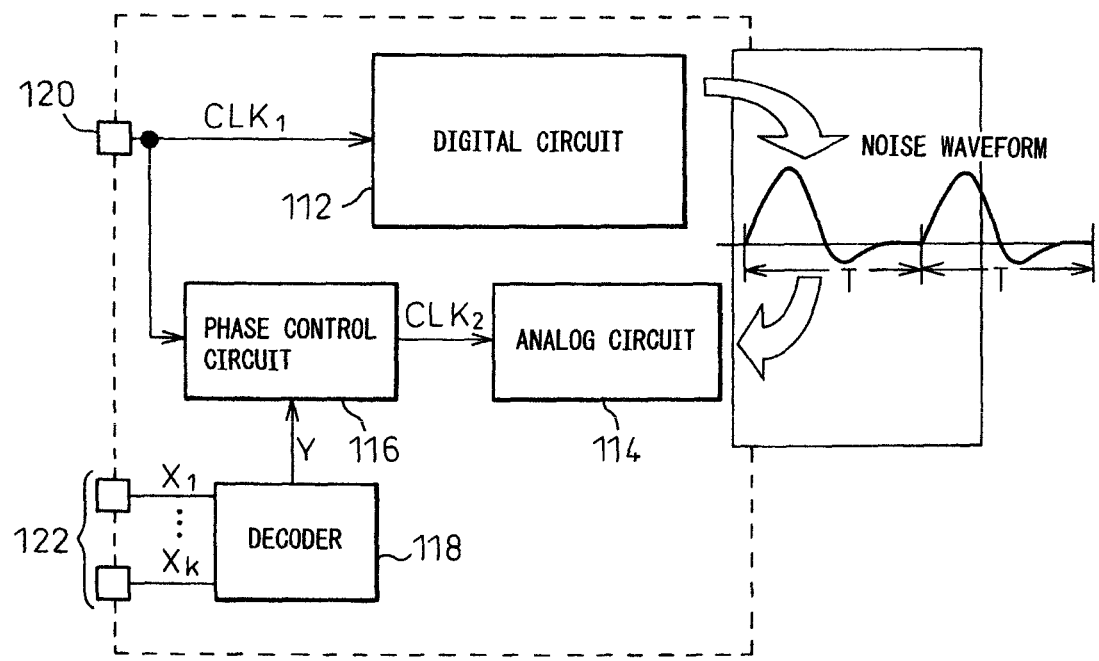
FIG. 1 is a block diagram illustrating one example of a related art electric circuit.

FIG. 1 is a block diagram illustrating one example of a related art electric circuit.

The related art electric circuit illustrated in FIG. 1 includes a digital circuit 112, an analog circuit 114, a phase control circuit 116, and a decoder 118. It is assumed here that the analog circuit 114 is affected by the noise generated in the digital circuit 112.

In the related art electric circuit, in order to reduce the effects of the noise generated in the digital circuit 112, the clock CLK2 supplied to the analog circuit 114 is shifted in phase relative to the clock CLK1 supplied to the digital circuit 112.

That is, generally, the noise waveform that the digital circuit 112 generates is synchronized to its operating clock CLK1. Further, the noise waveform increases and decreases in cyclic fashion within one period T of the clock CLK1.

In view of this, in the related art electric circuit illustrated in FIG. 1, the analog circuit is operated in synchronism with the timing when the noise decreases, thereby aiming to reduce the adverse effects of the noise generated from the digital circuit 112.

That is, as is often the case, the length of time that elapses from the time the clock CLK1 rises until the time the noise decreases is constant because of the nature of the digital circuit. Taking advantage of this, the clock CLK2 is created by delaying the operating clock CLK1 of the digital circuit 112 in a controlled manner through the phase control circuit 116, and this clock CLK2 is supplied to the analog circuit 114. In this way, the analog circuit 114 is operated in synchronism with the timing when the noise generated from the digital circuit 112 decreases.

More specifically, the phase control circuit 116 creates the clock CLK2 by delaying the clock CLK1, taken at a clock input terminal 120, by a predetermined time defined by a control signal Y applied from the decoder 118, and supplies the thus created clock CLK2 to the analog circuit 114. Here, the decoder 118 generates the control signal Y by decoding the code signals X1 to Xk supplied via code signal input terminals 122.

Figure 2:
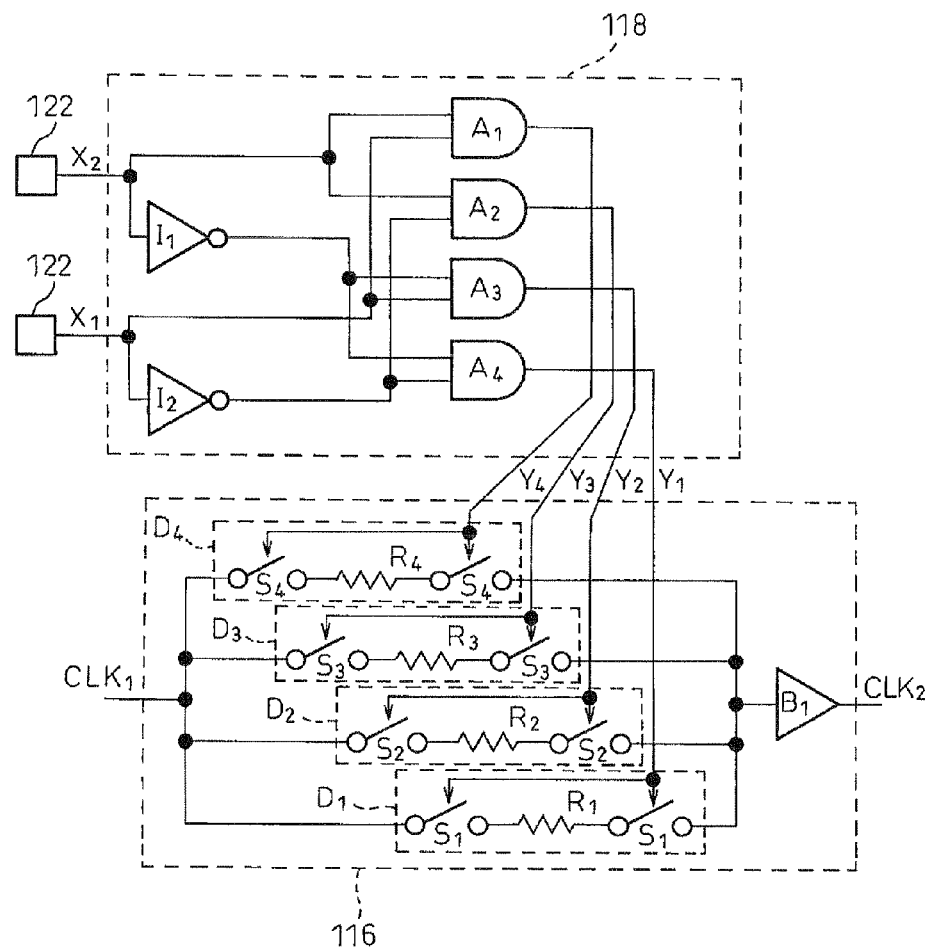
FIG. 2 is a circuit diagram schematically illustrating a decoder and a phase control circuit in the electric circuit of FIG. 1.

FIG. 2 is a circuit diagram schematically illustrating the decoder and the phase control circuit in the electric circuit of FIG. 1.

As illustrated in FIG. 2, the decoder 118 is constructed using, for example, inverters I1 and I2 and AND gates A1 to A4, and the phase control circuit 116 is constructed using a plurality of delay units D1 to D4, which provide different delay times, and a buffer E1.

The code signals X1 and X2 supplied via the terminals 122 are decoded by the decoder 118, and switches Si to S4 in the delay units D1 to D4 are selectively operated by the respective control signals Y1 to Y4, thereby creating the clock CLK2 by providing a prescribed delay time to the clock CLK1.

Figure 3:
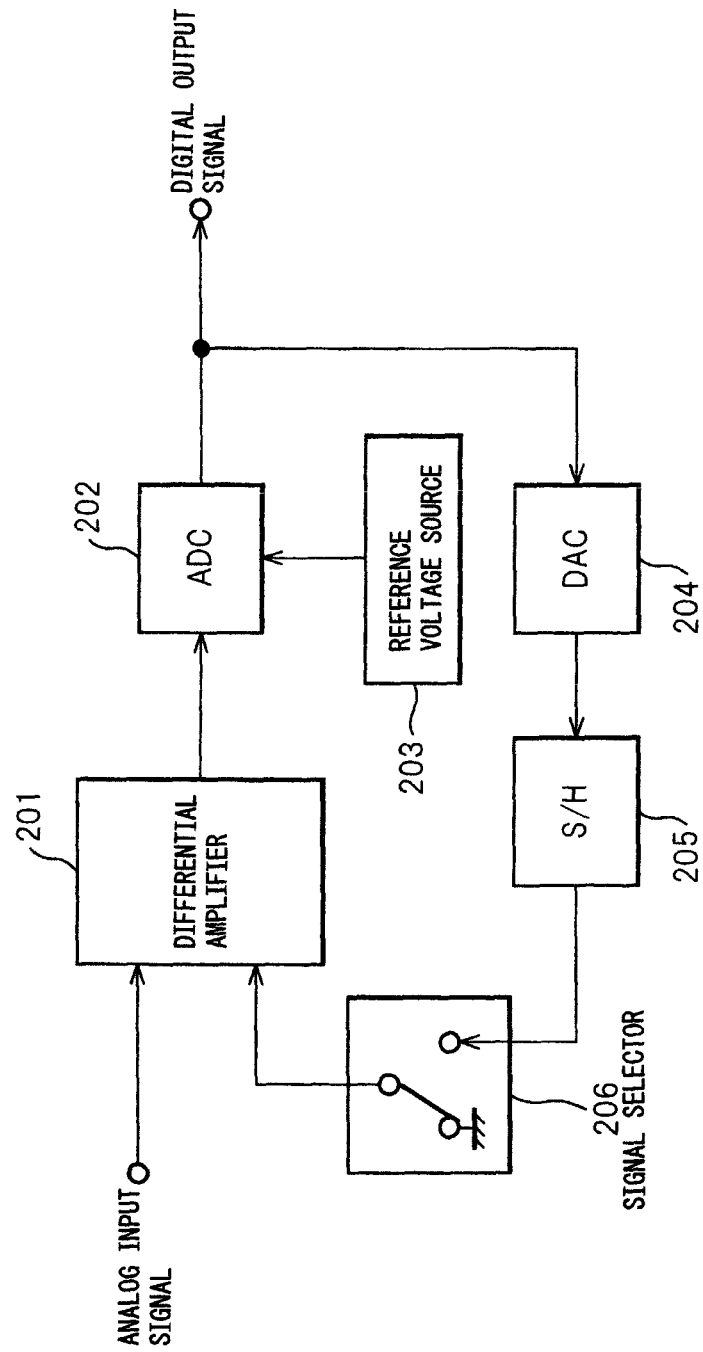
FIG. 3 is a block diagram illustrating another example of a related art electric circuit.

FIG. 3 is a block diagram illustrating another example of a related art electric circuit.

The related art electric circuit illustrated in FIG. 3 includes a differential amplifier 201, an ADC 202, a reference voltage source 203, a DAC (digital/analog converter) 204, an S/H (sample-and-hold circuit) 205, and a signal selection circuit 206.

In operation, the effect of the noise to which the ADC 202 is subjected is sampled by the DAC 204 and stored into the S/H 205, and the noise component stored in the S/H 205 is supplied via the signal selection circuit 206 to the differential amplifier 201 where the noise is canceled. That is, the DC component of the noise generated within the electric circuit is subtracted from the analog input signal, thereby removing the DC voltage component due to the noise as well as the temperature variation component of the DC voltage in the differential amplifier.

The related art electric circuit examples described above are both based on the premise that the digital and analog circuits operate with the same clock frequency.

However, in recent years, LSI circuits having a plurality of circuit blocks that operate with different clock frequencies have been increasing in number, making it increasingly difficult to address the problem by the related art circuit configuration designed to operate with the same clock frequency.

More specifically, for example, in the case of a circuit in which a clock input dedicated to the digital circuit is provided separately from the sampling clock of the ADC so that the digital circuit that may become a noise source operates asynchronously with respect to the analog circuit, it has been difficult with the related art electric circuits to sufficiently reduce the adverse effects of the noise.

Preferred embodiments of an electric circuit and a signal processing method will be described below with reference to the accompanying drawings.

Figure 4:
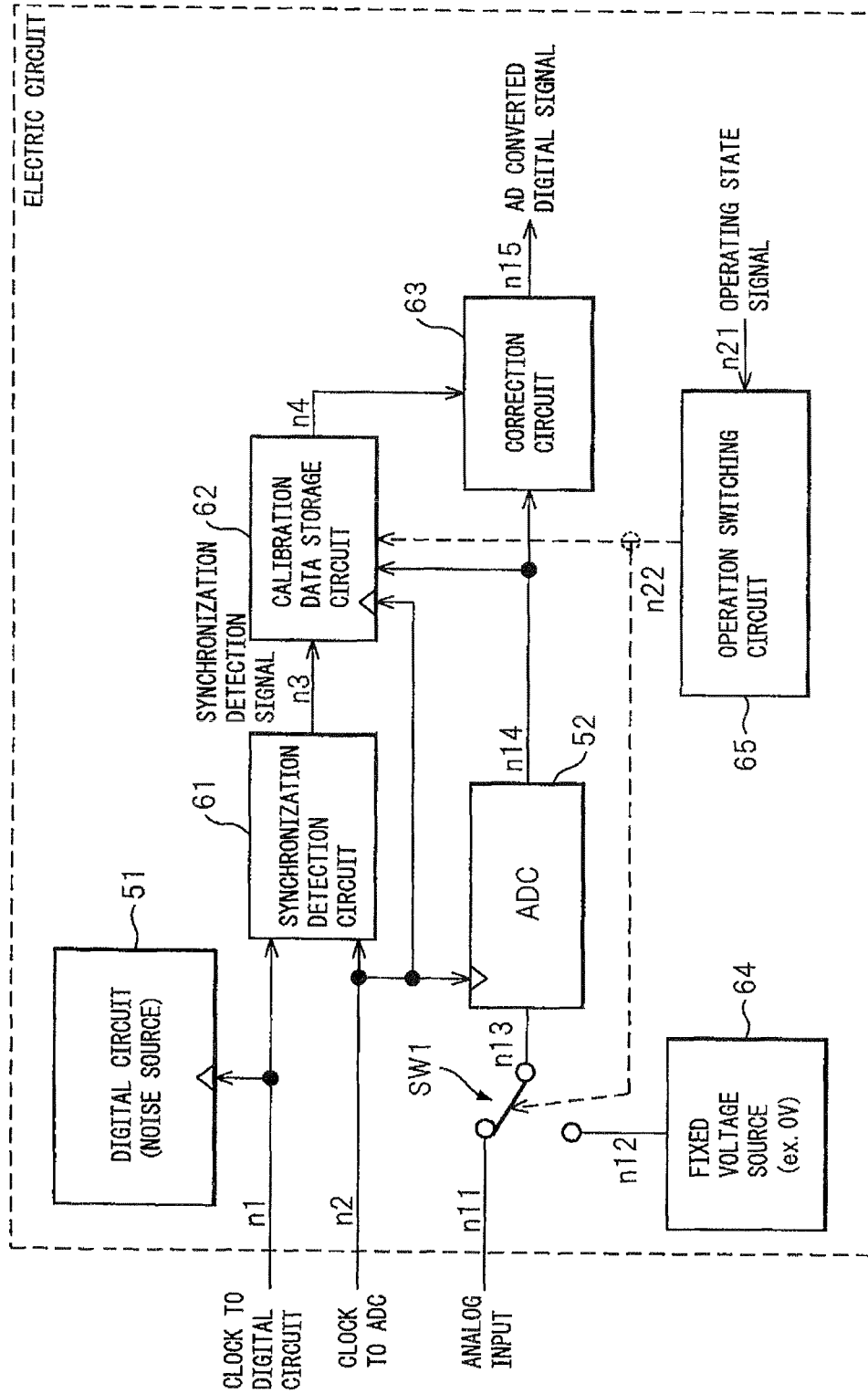
FIG. 4 is a block diagram illustrating an electric circuit according to a first embodiment.

FIG. 4 is a block diagram illustrating an electric circuit according to a first embodiment.

As illustrated in FIG. 4, the electric circuit of the first embodiment includes a digital circuit (first circuit) 51, a synchronization detection circuit 61, a calibration data storage circuit 62, a correction circuit 63, a fixed voltage source 64, an operation switching circuit 65, and an ADC (analog/digital converter: second circuit) 52.

The digital circuit 51 operates with a first clock n1, and the ADC 52 operates with a second clock n2 whose frequency is different from that of the first clock n1. The synchronization detection circuit 61 receives the first clock n1 and the second clock n2, detects synchronization between them, and supplies a synchronization detection signal n3 to the calibration data storage circuit 62.

The electric circuit of the first embodiment has two operation modes, a calibration data acquisition mode for acquisition of calibration data and a normal operation mode for analog-to-digital conversion of an analog input.

The fixed voltage source 64 provides supply voltage, reference voltage, etc. to the ADC 52, and the operation switching circuit 65 switches the operation of the ADC 52 by checking the operating state signal n21 of the circuit and needs to be designed in accordance with the code assignment of the operating state signal n21. More specifically, if the operating state signal n21 is an enable signal for the ADC 52, the operation switching circuit 65 may be constructed from a through-buffer.

Figure 5:
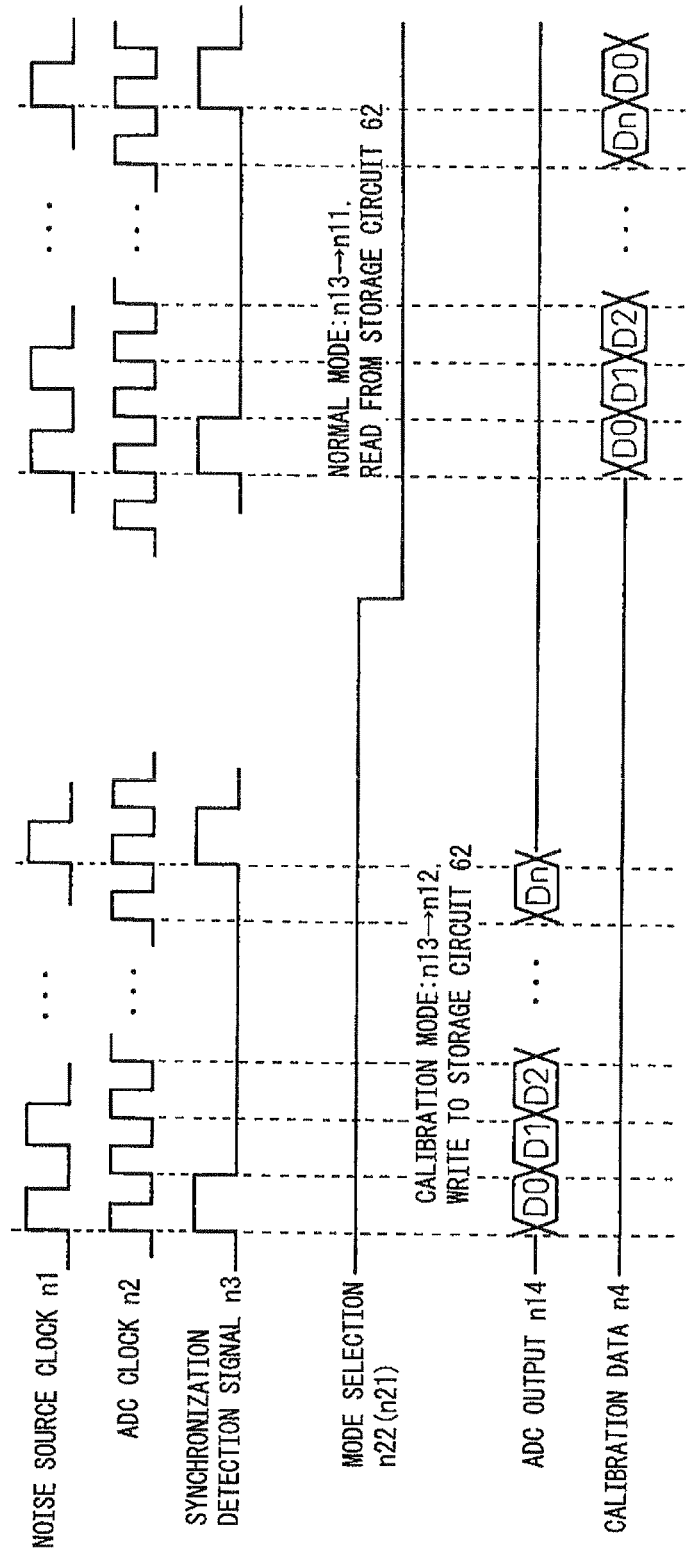
FIG. 5 is a timing diagram for explaining one example of the operation of the electric circuit illustrated in FIG. 4.
Figure 6:
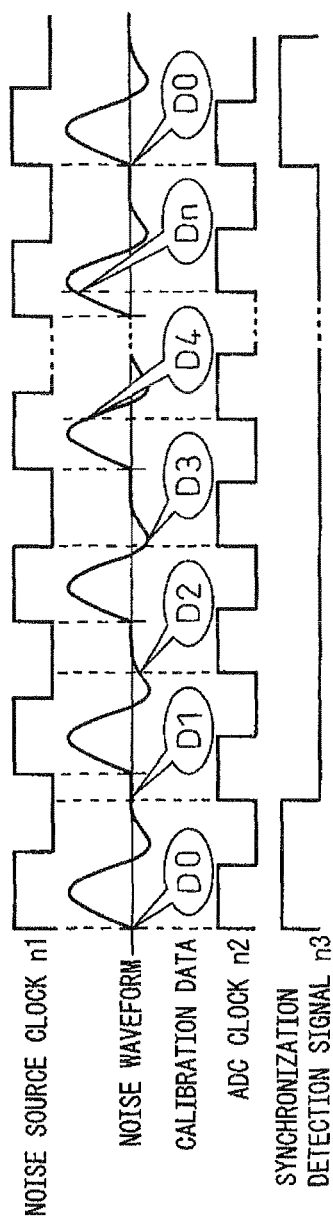
FIG. 6 is a diagram for explaining the relationship between noise waveform and calibration data acquisition timing in the one example of the operation of the electric circuit illustrated in FIG. 4.

FIG. 5 is a timing diagram for explaining one example of the operation of the electric circuit illustrated in FIG. 4, and FIG. 6 is a diagram for explaining the relationship between the noise waveform and the calibration data acquisition timing in the one example of the operation of the electric circuit illustrated in FIG. 4.

First, as illustrated in the left-hand half of FIG. 5 and FIG. 6, in the calibration data acquisition mode, the mode selection signal n22 from the operation switching circuit 65 goes to a high level "H" and the switch SW1 is controlled so that the predetermined voltage n12 from the fixed voltage source 64 is supplied as an input signal n13 to the ADC 52. Here, the operation switching circuit 65 controls the level of the mode selection signal n22 by checking the operating state signal n21 to see whether the operation mode is the calibration data acquisition mode or the normal operation mode.

In the calibration data acquisition mode, when the first clock n1 and the second clock n2 simultaneously rise, and the synchronization detection signal n3 is output from the synchronization detection circuit 61, data is latched by the rising edge of the second clock n2 (the operating clock of the ADC 52). That is, the output data D0 to Dn (output noise pattern) of the ADC 52 are sequentially latched into the calibration data storage circuit 62 and stored (recorded) therein.

Here, the output noise pattern of the ADC 52 is stored into the calibration data storage circuit 62 over a period starting from the time that the first synchronization is detected when the first clock n1 and the second clock n2 simultaneously rise and lasting at least until the time that a subsequent second synchronization is detected. In this way, the effects of the noise waveform generated by the digital circuit (noise source) 51 may be stored into the calibration data storage circuit 62 through the transfer function of the ADC 52.

On the other hand, in the normal operation mode, as illustrated in the right-hand half of FIG. 5, the mode selection signal n22 from the operation switching circuit 65 goes to a low level "L" and the switch SW1 is controlled so that the analog input signal n11 is supplied as the input signal n13 to the ADC 52.

Then, the correction circuit 63 removes the noise component from the output signal n14 of the ADC 52 by using the output noise pattern (calibration data) n4 stored in the calibration data storage circuit 62, and outputs the AD converted digital signal n15.

Here, the calibration data is stored into the calibration data storage circuit 62 over a period starting from the time that the synchronization detection signal n3 goes active and lasting until it goes active next time, and this period corresponds to the least common multiple of the period of the operating clock n1 of the digital circuit 51 and the period of the operating clock n2 of the ADC 52.

In the operation of the correction circuit 63 using the calibration data n4, the calibration data n4 may, for example, be simply subtracted from the output signal n14 of the ADC 52, but the operation may be modified variously according to the circuit design, etc. of the ADC 52.

Further, the period over which the output noise pattern of the ADC 52 is stored into the calibration data storage circuit 62 need not necessarily be made strictly equal to the least common multiple of the two clock periods; rather, if the processing is performed by allowing some margin, as will be described later, the amount of data to be stored may be reduced.

Alternatively, the calibration data n4 may be obtained, for example, by performing noise simulation or by making measurements on a test chip. In this case, the fixed voltage source 64, the switch SW1, and the operation switching circuit 65 may be eliminated from the electric circuit.

As described above, according to the present embodiment, it becomes possible to produce a highly reliable digital signal by reducing the adverse effects of the noise from the noise source digital circuit and by thus performing the analog/digital conversion with high accuracy using the ADC. That is, by storing the effects of the noise and applying correction in synchronous fashion using the synchronization detection circuit, it becomes possible to apply the correction even in the case of asynchronous noise.

Further, according to the present embodiment, even in situations where the accuracy of a 10-bit ADC, for example, would drop to about 8 bits because of the effects of noise, it becomes possible to retain the intended 10-bit accuracy.

Figure 7:
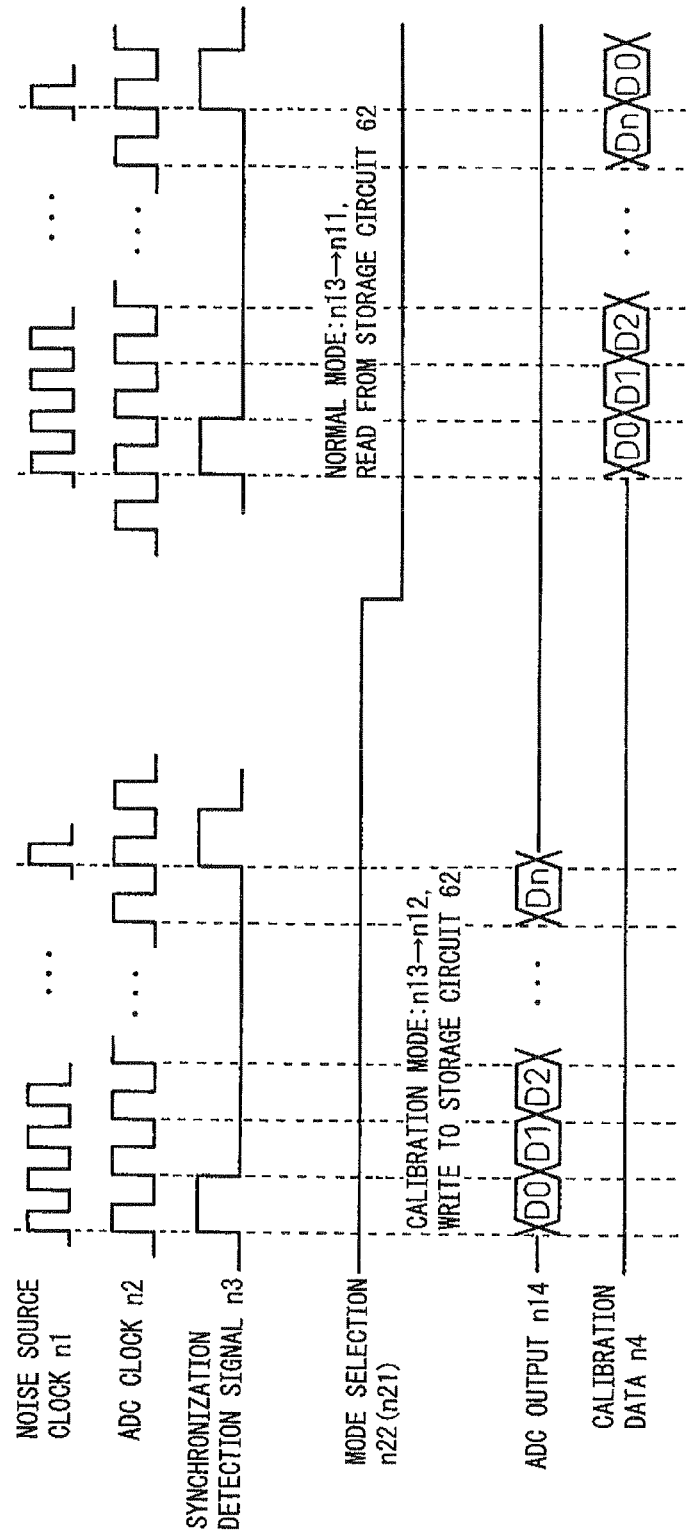
FIG. 7 is a timing diagram for explaining an alternative example of the operation of the electric circuit illustrated in FIG. 4.
Figure 8:
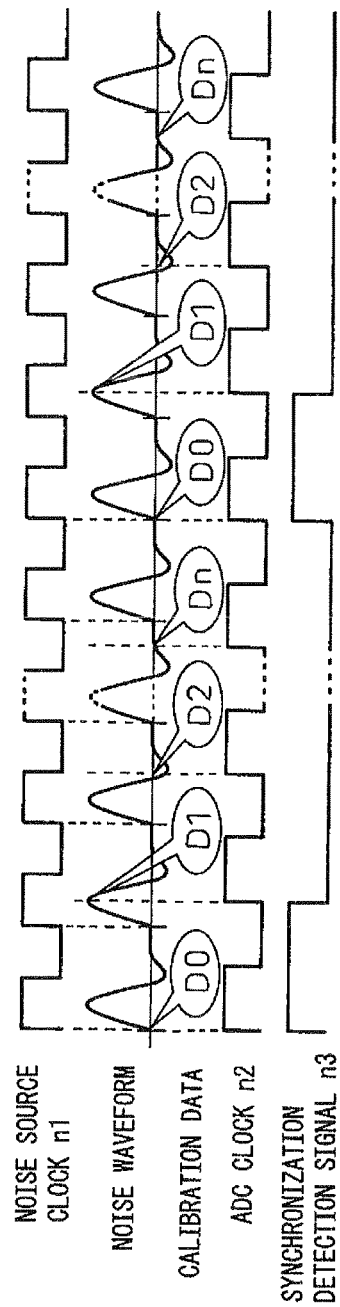
FIG. 8 is a diagram for explaining the relationship between noise waveform and calibration data acquisition timing in the alternative example of the operation of the electric circuit illustrated in FIG. 4.

FIG. 7 is a timing diagram for explaining an alternative example of the operation of the electric circuit illustrated in FIG. 4, and FIG. 8 is a diagram for explaining the relationship between the noise waveform and the calibration data acquisition timing in the alternative example of the operation of the electric circuit illustrated in FIG. 4.

As is apparent from a comparison between FIG. 4, FIG. 5 and FIG. 7, FIG. 8, the period of the first clock n1 is longer than the period of the second clock n2 in FIG. 4 and FIG. 5, while on the other hand, in FIG. 7 and FIG. 8, the period of the first clock n1 is made shorter than the period of the second clock n2. However, there is no essential difference in processing between the two examples.

In this way, according to the present embodiment, the adverse effects of the noise from the noise source circuit may be reduced, regardless of whether the period of the first clock (noise source clock) n1 is longer or shorter than the period of the second clock (ADC clock) n2. If the period of the first clock n1 is the same as the period of the second clock n2, the output noise pattern during that same period is latched into the calibration data storage circuit 62.

Figure 9:
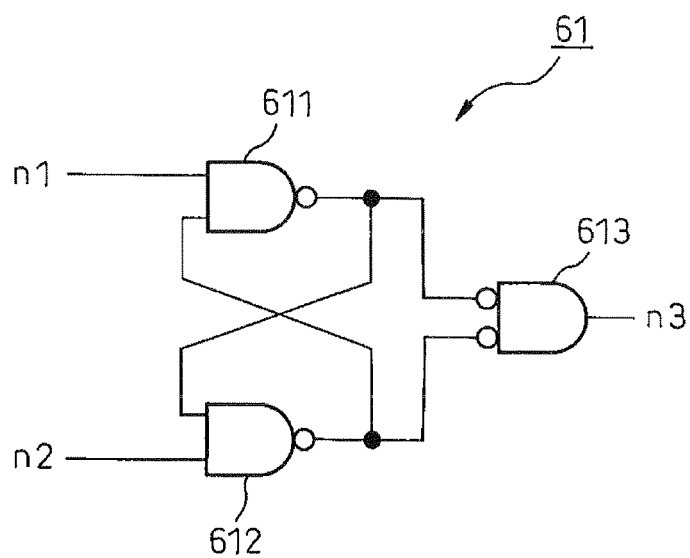
FIG. 9 is a circuit diagram illustrating one example of a synchronization detection circuit in the electric circuit of FIG. 4.

FIG. 9 is a circuit diagram illustrating one example of the synchronization detection circuit 61 in the electric circuit of FIG. 4.

As illustrated in FIG. 9, the synchronization detection circuit 61 includes, for example, cross-connected NAND gates 611 and 612 and an AND gate 613 having inverted logic inputs. With this configuration, the synchronization detection circuit 61 generates the synchronization detection signal n3 by performing logical operations between the first clock n1 and the second clock n2.

The synchronization detection circuit 61 illustrated in FIG. 9 is only one example and may be modified variously, but in actual circuit design, it is important to determine how much margin may be allowed for synchronization detection error. If the error margin is made too small, the amount of circuitry (storage capacity) of the calibration data storage circuit 62 has to be increased; conversely, if the error margin is made too large, the accuracy of the calibration data drops, making it difficult to sufficiently reduce the effects of the noise.

In view of this, in order to properly set the margin for synchronization detection error, it is preferable to use, for example, a predetermined allowable error range (noise sensitive time range), as will be described later with reference to FIG. 12A to FIG. 12C.

Figure 10:
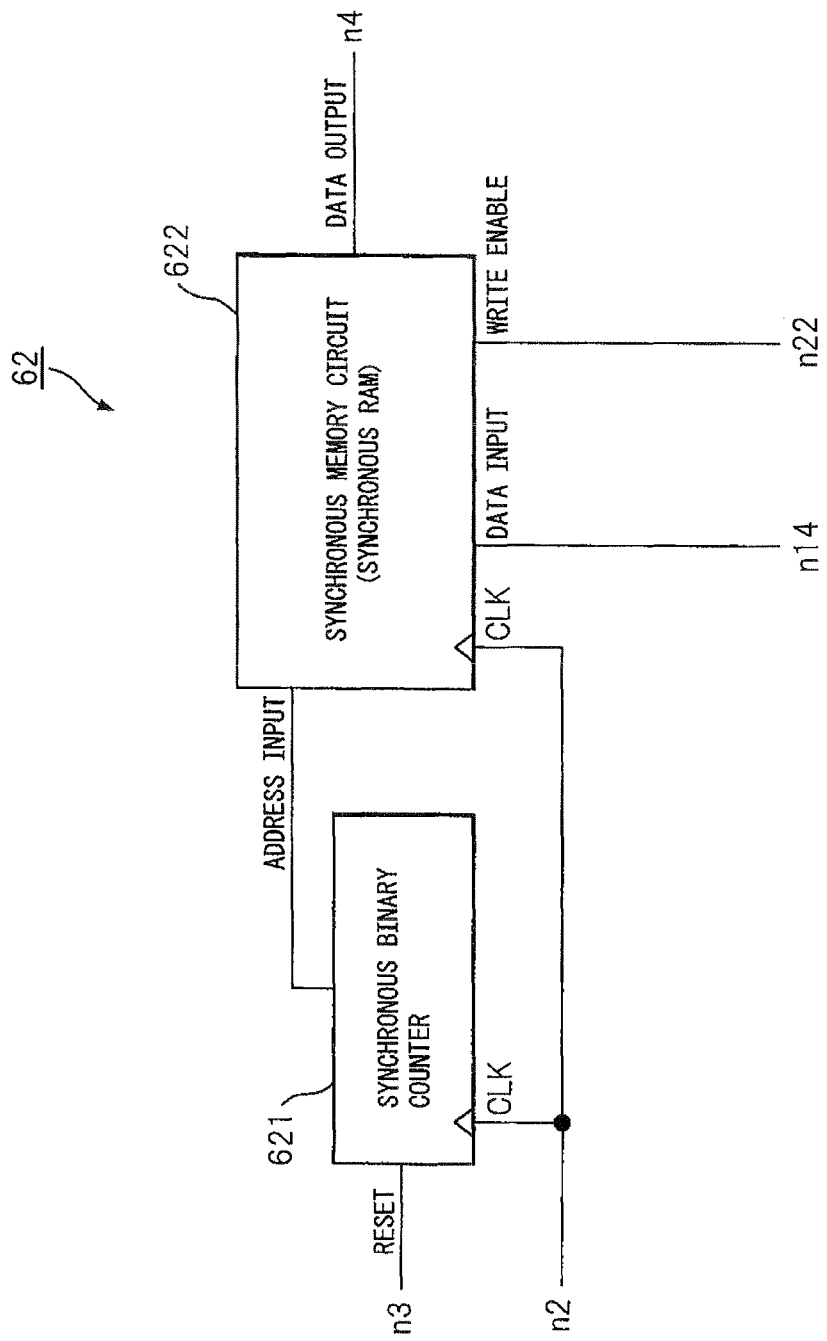
FIG. 10 is a block diagram illustrating one example of a calibration data storage circuit in the electric circuit of FIG. 4.

FIG. 10 is a block diagram illustrating one example of the calibration data storage circuit 62 in the electric circuit of FIG. 4.

As illustrated in FIG. 10, the calibration data storage circuit 62 includes, for example, a synchronous binary counter 621 and a synchronous memory circuit (synchronous RAM) 622. Here, the second clock n2 is supplied to the clock terminal CLK of the synchronous binary counter 621 as well as to the clock terminal CLK of the synchronous memory circuit 622, while the synchronization detection signal n3 is supplied to the reset terminal of the synchronous binary counter 621.

Further, the counter output signal from the synchronous binary counter 621 is supplied to the address terminal of the synchronous memory circuit 622, while the output signal n14 of the ADC 52 is supplied to the data input terminal of the synchronous memory circuit 622. On the other hand, the output signal n22 of the operation switching circuit 65 is supplied to the write enable terminal of the synchronous memory circuit 622.

In the calibration data acquisition mode, the output signal n14 of the ADC 52 is written to the address in the synchronous memory circuit 622 specified by the counter output signal of the synchronous binary counter 621 upon application of the second clock n2. On the other hand, in the normal operation mode, the calibration data (data output) written to the synchronous memory circuit 622 is read out by the second clock n2, and the thus readout calibration data n4 is supplied to the correction circuit 63.

Figure 11:
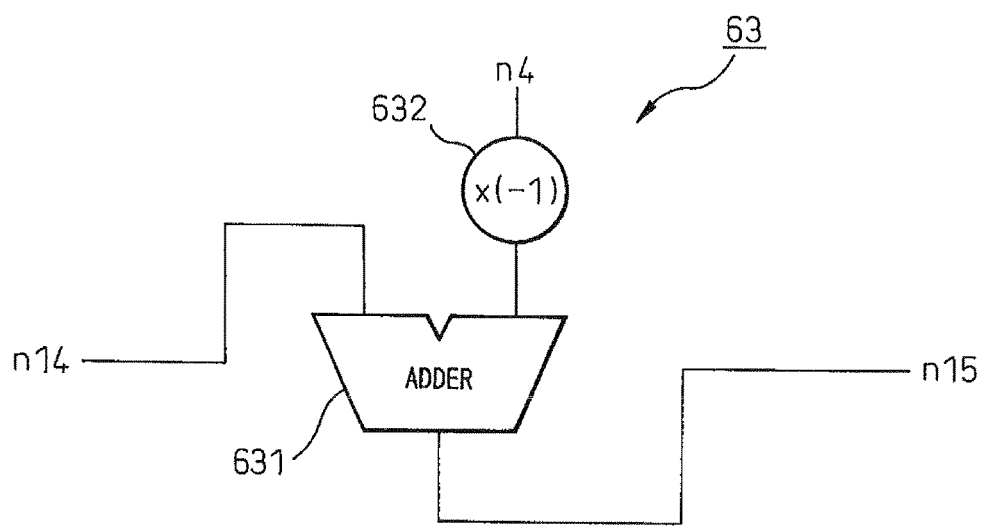
FIG. 11 is a circuit diagram illustrating one example of a correction circuit in the electric circuit of FIG. 4.

FIG. 11 is a circuit diagram illustrating one example of the correction circuit 63 in the electric circuit of FIG. 4.

As illustrated in FIG. 11, the correction circuit 63 includes an adder 631 and an inverter circuit 632, and outputs the AD converted digital signal n15 by subtracting the calibration data n4 from the output signal n14 of the ADC 52 (n15=n14−n4).

The correction circuit 63 is not specifically limited to the of RIG. 11, but the circuit configuration may be modified variously, for example, according to the circuit design of the ADC 52. More specifically, the AD converted digital signal n15 may be produced, for example, by subtracting from the output signal n14 of the ADC 52 a value obtained by multiplying the product of the calibration data n4 and the output signal n14 by a correction coefficient α. $n15=n14−n14 \times n4 \times \alpha$ Here, the correction coefficient α is a value unique to the ADC 52, and may be obtained, for example, by simulation.

Figure 12A:
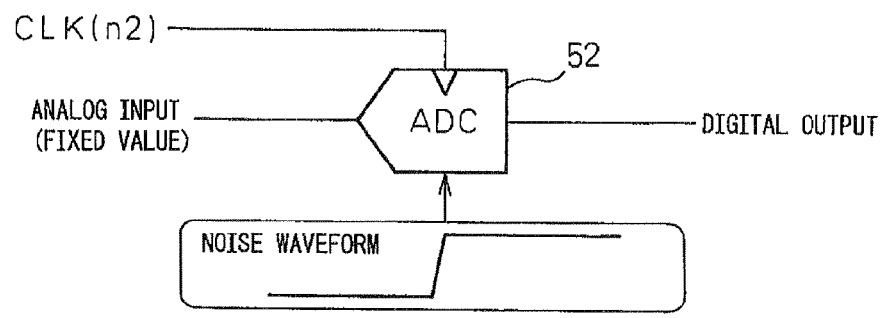
FIG. 12A is a diagram (part 1) for explaining how noise sensitive time range is obtained.
Figure 12B:
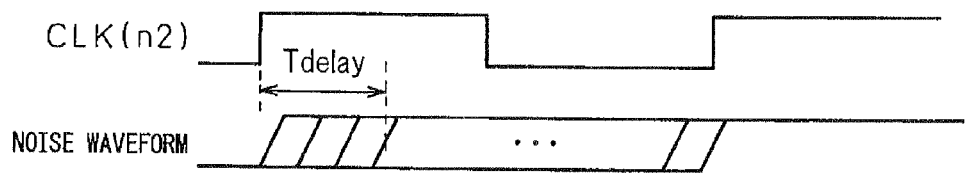
FIG. 12B is a diagram (part 2) for explaining how noise sensitive time range is obtained.
Figure 12C:
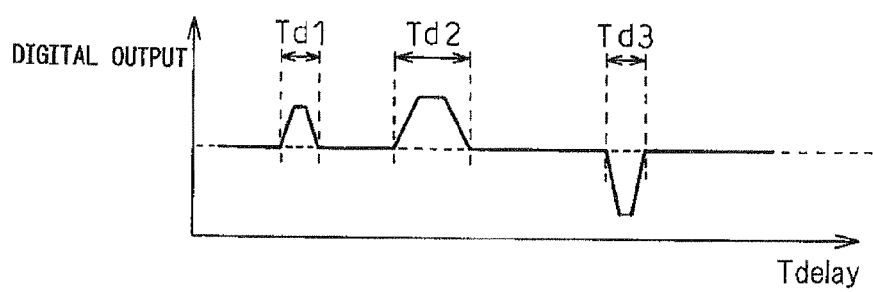
FIG. 12C is a diagram (part 3) for explaining how noise sensitive time range is obtained.

FIG. 12A and FIG. 12C are diagrams for explaining how the noise sensitive time range is obtained.

As earlier described, the noise sensitive time range may be used in order to properly set the margin for synchronization detection error in the synchronization detection circuit 61. The noise sensitive time range refers to an allowable error range defined by a time range such as Td1, Td2, and Td3 corresponding to the peak or valley portions of the digital output signal for the fixed analog input, as illustrated, for example, in FIG. 12C. The noise sensitive time range in the output signal n14 of the ADC 52 may be obtained by simulation or through measurement.

More specifically, as illustrated in FIG. 12A and FIG. 12B, the digital output value is recorded when the noise waveform applied to the ADC 52 is scanned with respect to the clock CLK (second clock n2) (Tdelay in FIG. 12B). When the digital value is plotted against Tdelay, peaks and valleys such as illustrated in FIG. 12C appear. Here, the noise is applied to the ADC 52, for example, via a power supply line or a predetermined signal line.

Then, it is determined that the first clock n1 and the second clock n2 are synchronized within a predetermined allowable error range which is, for example, smaller than a predetermined noise sensitive time range (for example, the shortest time range Td1) taken from among the Tdelay time ranges (noise sensitive time ranges) corresponding to the peak or valley portions.

In the above example, when there are a plurality of time ranges (three time ranges Td1, Td2, and Td3) corresponding to the peak or valley portions as illustrated in FIG. 12C, the smallest time range has been defined as the noise sensitive time range, but the present embodiment is not restricted to the above example. For example, when there are a plurality of time ranges corresponding to the peak or valley portions as illustrated in FIG. 12C, the largest time range or the smallest time range or their average may be chosen as the noise sensitive time range.

More specifically, in the synchronization detection circuit 61 illustrated in FIG. 9, for example, the noise sensitive time range corresponding to the synchronization detection error may be set by adjusting the delay time of the NAND gates 611 and 612; as an example, it may be set as a time range of about 400 ps.

Figure 13:
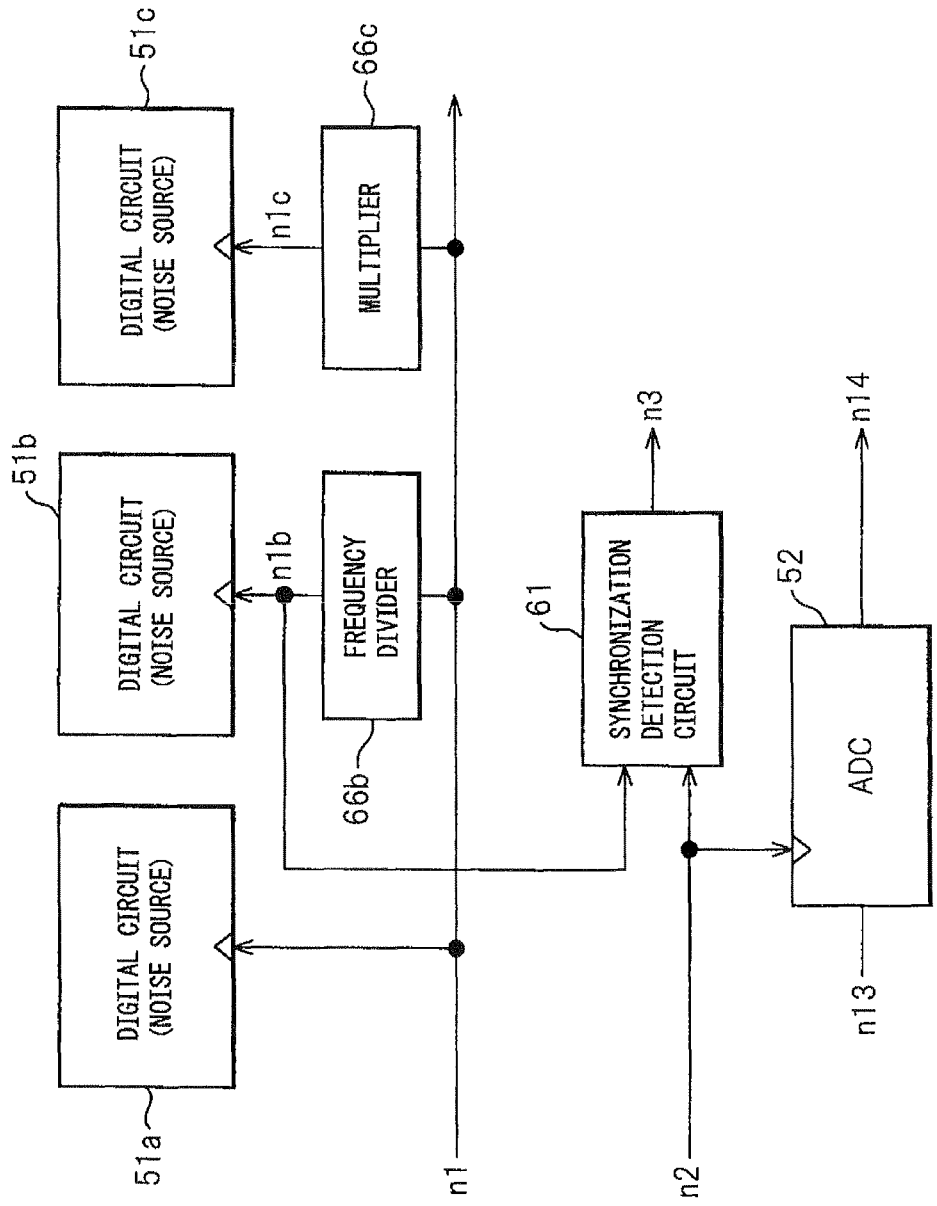
FIG. 13 is a block diagram illustrating an electric circuit according to a second embodiment.

FIG. 13 is a block diagram illustrating an electric circuit according to a second embodiment.

As illustrated in FIG. 13, the electric circuit of the second embodiment includes three digital circuits (noise sources) 51a, 51b, and 51c which are driven by clocks n1, n1b, and n1c of different frequencies. It is assumed here that the ADC 52 is affected by the noise generated from these three digital circuits 51a, 51b, and 51c.

Further, the clock n1b for driving the digital circuit 51b is output from a frequency divider 66b that divides the frequency of the first clock n1 by x, and the clock n1c for driving the digital circuit 51c is output from a frequency multiplier 66c that multiplies the frequency of the first clock n1 by y. Here, x and y are integers larger than 1. Therefore, the relation n1b<n1<n1c holds among the frequencies of the clocks n1, n1b, and n1c that drive the respective digital circuits 51a, 51b, and 51c.

In the electric circuit of the second embodiment, the synchronization detection circuit 61 detects synchronization between the clock n1b that drives the digital circuit 51b and the second clock n2 that drives the ADC 52, and outputs the synchronization detection signal n3.

That is, when there are a plurality of digital circuits as noise sources, the clock n1b having the lowest frequency (the longest period) among the clocks n1, n1b, and n1c that drive the respective digital circuits 51a, 51b, and 51c is compared with the second clock n2 to detect synchronization between them. Then, based on the synchronization detected between the clocks nib and n2, the calibration data is acquired and the processing for noise reduction is performed using the acquired calibration data.

Accordingly, the noise reduction may be accomplished by using the calibration data acquired over a shorter period than would be the case if the synchronization had to be detected between each of the clocks n1, n1b, and n1c and the second clock n2, and thus without requiring a significant increase in the storage capacity of the calibration data storage circuit 62 (synchronous memory circuit 622).

Figure 14:
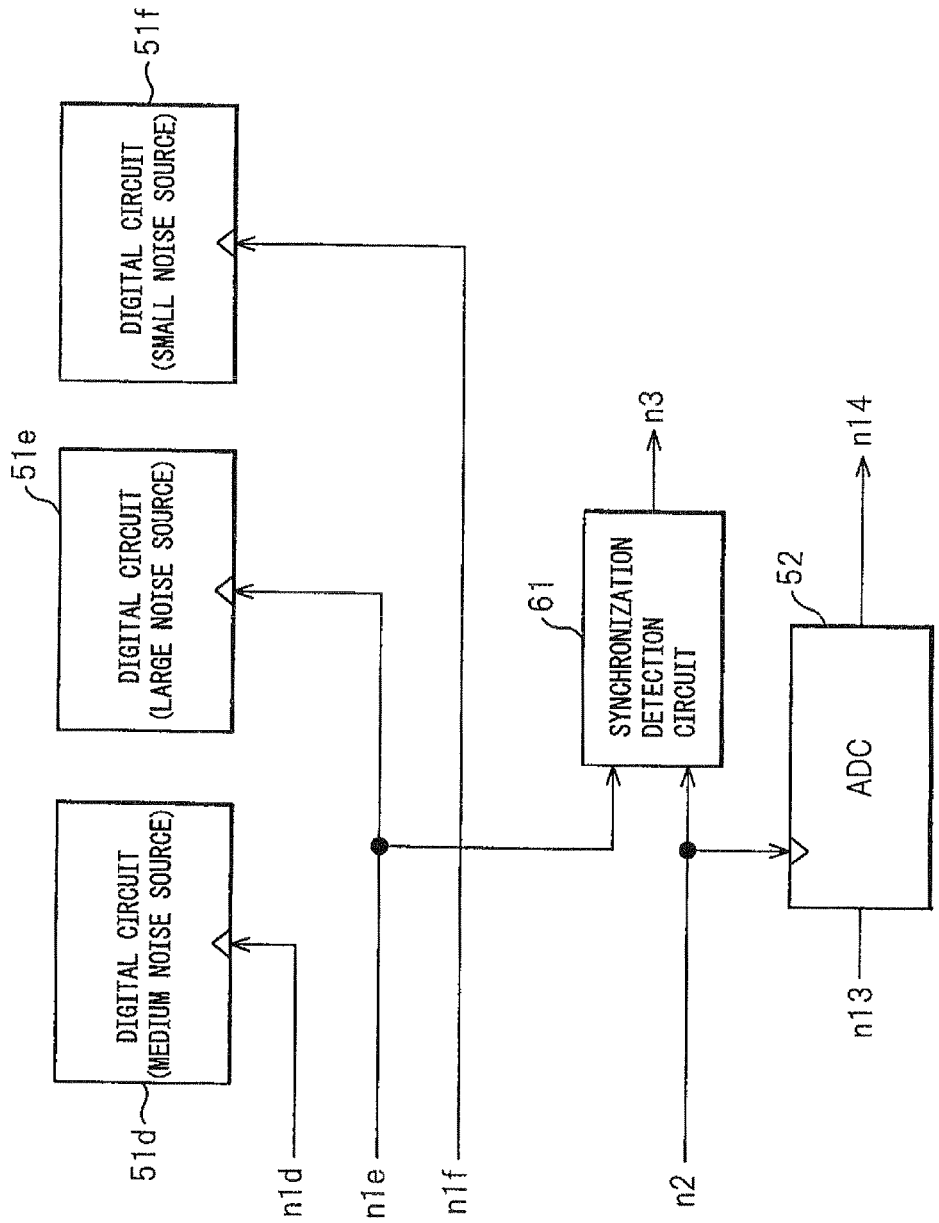
FIG. 14 is a block diagram illustrating an electric circuit according to a third embodiment.

FIG. 14 is a block diagram. illustrating an electric circuit according to a third embodiment.

As illustrated in FIG. 14, the electric circuit of the third embodiment includes three digital circuits 51d, 51e, and 51f which are driven by clocks n1d, n1e, and n1f of different frequencies. It is assumed here that the ADC 52 is affected by the noise generated from these three digital circuits 51d, 51e, and 51f.

It is also assumed that the digital circuit 51e generates large noise, the digital circuit 51f generates small noise, and the digital circuit 51d generates some noise whose magnitude is intermediate between those generated by the digital circuits 51e and 51f.

Therefore, the relation 51f<51d<51e holds among the digital circuits 51d, 51e, and 51f in terms of the amount of generated noise.

In the electric circuit of the third embodiment, the synchronization detection circuit 61 detects synchronization between. the clock n1e that drives the digital circuit 51e and the second clock n2 that drives the ADC 52, and outputs the synchronization detection signal n3.

That is, when there are a plurality of digital circuits as noise sources, the clock n1e that drives the digital circuit 51e which is the largest noise source among the digital circuits 51d, 51e, and 51f is compared with the second clock n2 to detect synchronization between them. Then, based on the synchronization detected between the clocks n1e and n2, the calibration data is acquired and the processing for noise reduction is performed using the acquired calibration data.

Accordingly, the noise reduction may be accomplished by using the calibration data acquired over a shorter period than would be the case if the synchronization had to be detected between each of the clocks n1d, n1e, and n1f and the second clock n2, and thus without requiring a significant increase in the storage capacity of the calibration data storage circuit 62.

Figure 15:
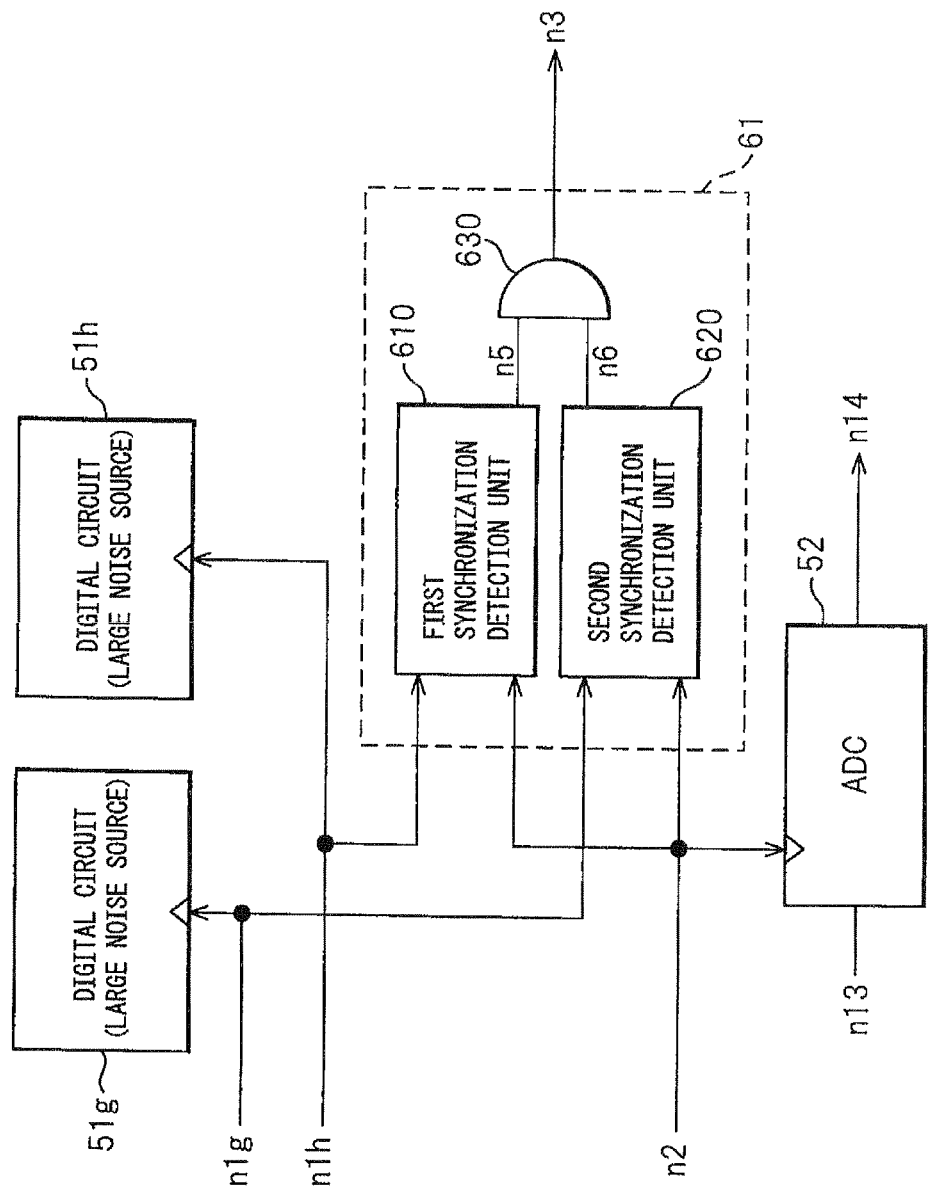
FIG. 15 is a block diagram illustrating an electric circuit according to a fourth embodiment.

FIG. 15 is a block diagram illustrating an electric circuit according to a fourth embodiment.

As illustrated in FIG. 15, the electric circuit of the fourth embodiment includes two digital circuits 51g and 51h which are driven by clocks n1g and n1h of different frequencies, It is assumed here that the ADC 52 is affected by the noise generated from these two digital circuits 51g and 51h, and that both of the digital circuits 51g and 51h generate large noise.

In the electric circuit of the fourth embodiment, the synchronization detection circuit 61 includes a first synchronization detection unit 610, a second synchronization detection unit 620, and an AND gate 630.

The first synchronization detection unit 610 detects synchronization between the clock n1h that drives the digital circuit 51h and the second clock n2 that drives the ADC 52. On the other hand, the second synchronization detection unit 620 detects synchronization between the clock n1g that drives the digital circuit 51g and the second clock n2.

The AND gate 630 performs a logical AND operation between the output signal (first synchronization detection signal) n5 of the first synchronization detection unit 610 and the output signal (second synchronization detection signal) n6 of the second synchronization detection unit 620, and outputs the synchronization detection signal n3.

That is, when there are a plurality of (for example, two) digital circuits 51g and 51h that generate large noise, each of the driving clocks n1g and n1h of the circuits that generate large noise is compared with the second clock n2 to detect synchronization between them.

Figure 16:
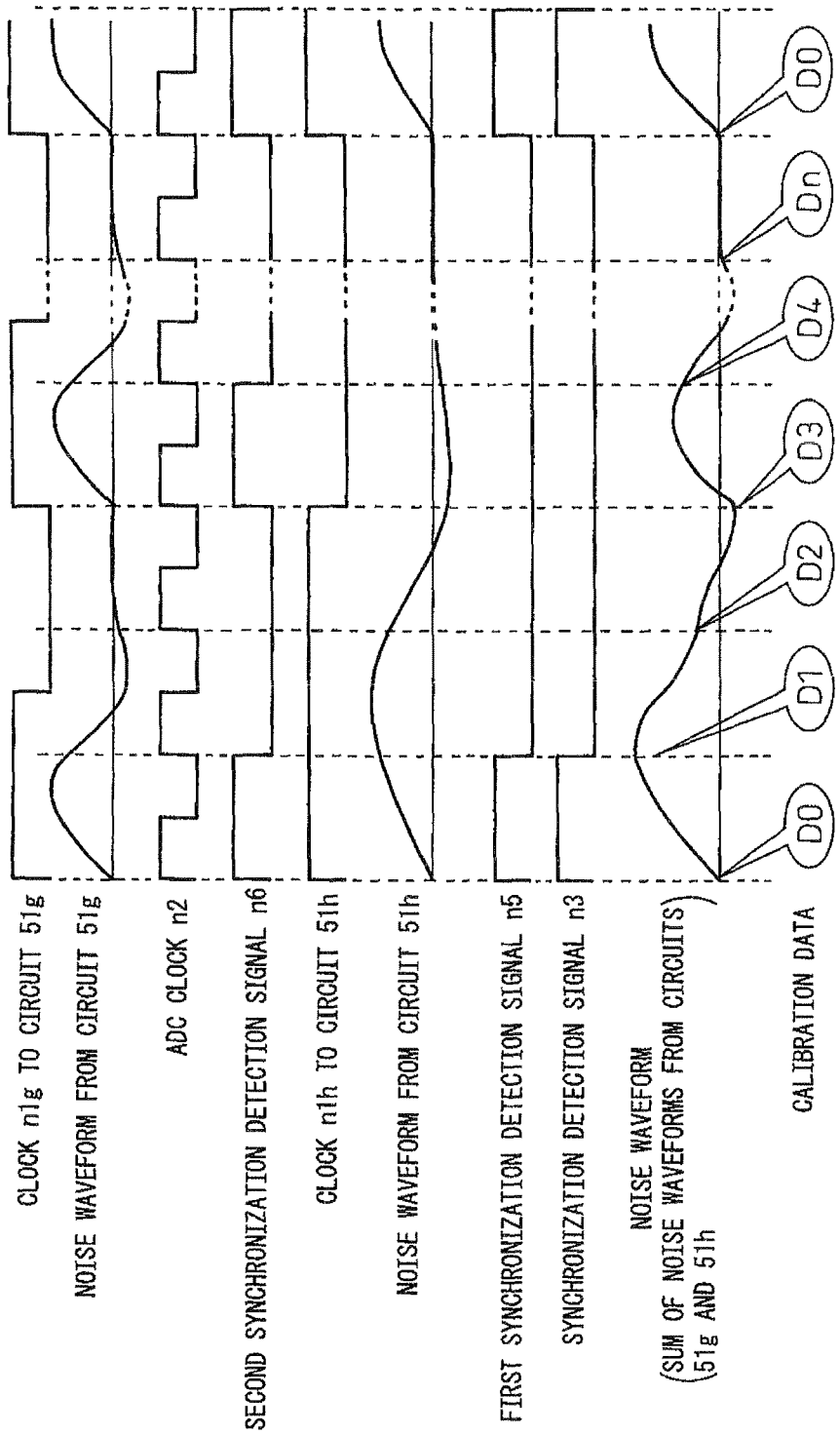
FIG. 16 is a timing diagram for explaining one example of the operation of the electric circuit illustrated in FIG. 15.

FIG. 16 is a timing diagram for explaining one example of the operation of the electric circuit illustrated in FIG. 15.

In FIG. 16, the first synchronization detection signal n5 is a synchronization signal detected between the clock n1h that drives the digital circuit 51h and the second clock n2 that drives the ADC 52. The second synchronization detection signal n6 is a synchronization signal detected between the clock n1g that drives the digital circuit 51g and the second clock n2 that drives the ADC 52. The synchronization detection signal n3 is a signal produced by ANDing the first synchronization detection signal n5 with the second synchronization detection signal n6.

As illustrated in FIG. 16, calibration data D0 to Dn is acquired over a period starting from the time that the synchronization detection signal n3 rises and lasting at least until the next rising edge of the synchronization detection signal n3 occurs.

The electric circuit of the fourth embodiment is effective when both of the digital circuits 51g and 51h generate large noise and there is thus a need to sufficiently reduce the noise. It is also advantageous in such cases as when the calibration data storage capacity 62 is provided with a large storage capacity or when the calibration data acquisition period does not substantially increase even if the synchronization detection is performed between each of the clocks n1g and n1h and the second clock n2.

In actual circuit design, various configurations may be provided, and the second to third embodiments illustrated in FIG. 13 to FIG. 15 are, for example, suitably combined may be possible.

In the above embodiments, the number of digital circuits as noise sources has been illustrated as being 2 or 3, but it will be recognized that the number of digital circuits is not specifically limited to 2 or 3 but may be suitably chosen. Further, the frequency of the clock to be supplied to each digital circuit need not necessarily be made different from the others; instead, the frequency of the clock may be made different for each predetermined number of circuit blocks.

While, in each of the above embodiments, the digital circuit has been illustrated as an example of the noise source and the analog ADC circuit as an example of the circuit that is affected by the noise, the noise source circuit and the circuit that is affected by the noise may be suitably chosen. More specifically, the embodiments may be effectively applied, for example, even when both the noise source circuit and the circuit that is affected by the noise are analog circuits.

Figure 17:
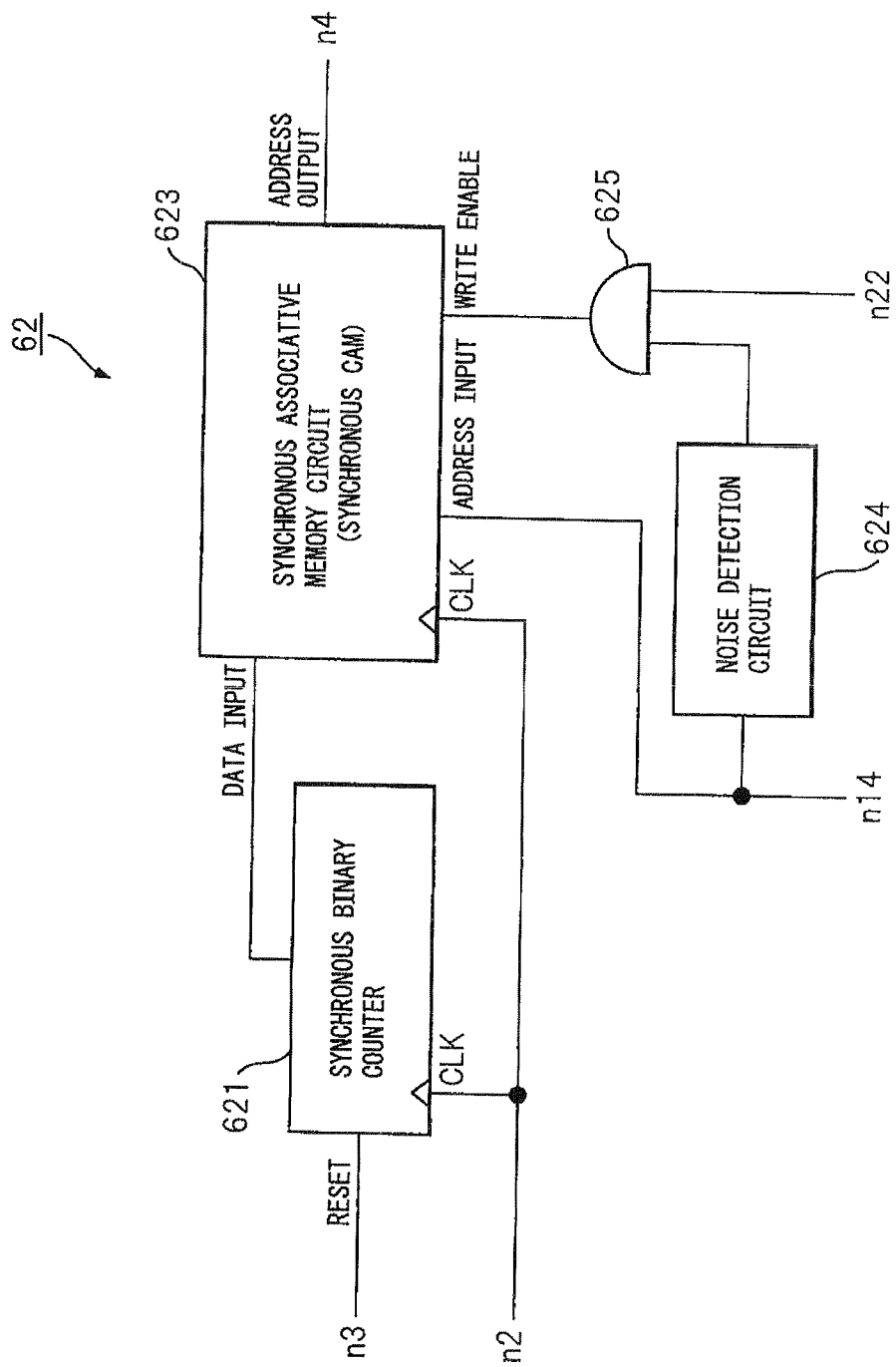
FIG. 17 is a block diagram illustrating another example of the calibration data storage circuit.

FIG. 17 is a block diagram illustrating another example of the calibration data storage circuit 62.

As is apparent from a comparison with the previously given FIG. 10, the calibration data storage circuit 62 illustrated in FIG. 17 includes a synchronous binary counter 621, a synchronous associative memory circuit (synchronous CAM (content addressable memory)) 623, a noise detection circuit 624, and an AND gate 625.

Here, the second clock n2 is supplied to the clock terminal CLK of the synchronous binary counter 621 as well as to the clock terminal CLK of the synchronous associative memory circuit 623, while the synchronization detection signal n3 is supplied to the reset terminal of the synchronous binary counter 621.

The present embodiment is suitable, for example, for the case where the first clock n1 and the second clock n2 differ widely in frequency and, if calibration data were to be acquired by detecting synchronization between them, a very large capacity memory circuit may be employed.

The noise detection circuit 624 detects the state in which noise is carried on the output signal n14 of the ADC 52 (for example, peaks and valleys appear in the digital output as illustrated in FIG. 12C). Here, the noise detection circuit 624 may be implemented using a multiple-input AND gate or the like when detecting, for example, whether the signal n14 is all 0s.

The counter output signal from the synchronous binary counter 621 is supplied to the data input terminal of the synchronous associative memory circuit 623, while the output signal n14 of the ADC 52 is supplied to the address input terminal of the synchronous associative memory circuit 623. On the other hand, the output signal of the AND gate 625 is supplied to the write enable terminal of the synchronous associative memory circuit 623.

In the calibration data acquisition mode, the counter output signal from the synchronous binary counter 621 is written to the address in the synchronous associative memory circuit 623 specified by the output signal n14 of the ADC 52 upon application of the second clock n2.

The output signal of the noise detection circuit 624 which detects noise from the output signal n14 of the ADC 52 and the output signal n22 of the operation switching circuit 65 are supplied to the AND gate 625 which then performs a logical AND operation between these signals.

That is, by ANDing the output of the noise detection circuit 624 with the signal n22, a write enable signal is applied to the synchronous associative memory circuit 623 only when noise (effective calibration data) is actually carried on the output signal n14 of the ADC 52. This serves to reduce the amount of circuitry of the synchronous associative memory circuit 623 by reducing the amount of the calibration data to be stored in the associative memory circuit 623.

On the other hand, in the normal operation mode, the calibration data (address output) written to the synchronous associative memory circuit 623 is read out by the second clock n2; here, the calibration data n4 acquired only when noise is carried is supplied to the correction circuit 63. Then, in the correction circuit 63, the noise component contained in the output signal n14 of the ADC 52 is effectively reduced by using the calibration data n4.

As described in detail above, according to the embodiments, it becomes possible to reduce the adverse effects of the noise by using the calibration data, even when the noise source circuit and the circuit that is affected by the noise are operating in asynchronous fashion.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An electric circuit comprising:
   a first circuit configured to operate with a first clock;
   a second circuit configured to operate with a second clock which is different in frequency from the first clock;
   a synchronization detection circuit configured to detect synchronization of the first and second clocks;
   a storage circuit configured to store an output noise pattern of the second circuit, based on the synchronization detected by the synchronization detection circuit; and
   a correction circuit configured to correct an output of the second circuit by using the output noise pattern.

2. The electric circuit as claimed in claim 1, wherein
   the first circuit is digital circuit, and
   the second circuit is an analog/digital converter.

3. The electric circuit as claimed in claim 2, the electric circuit further comprising:
   a third circuit, including at least one digital circuit, configured to operate with a third clock which is different in frequency from any of the first and second clocks, and wherein
   the synchronization detection circuit detects synchronization of the third clock as well as synchronization of the first and second clocks.

4. The electric circuit as claimed in claim 2, the electric circuit further comprising:
   a third circuit, including at least one digital circuit, configured to operate with a third clock which is different in frequency from any of the first and second clocks, and wherein
   noise caused by the third circuit is smaller than noise caused by the first circuit, and
   the synchronization detection circuit detects synchronization of the second clock with respect to the clock that drives the first circuit or the third circuit, whichever is the larger noise source.

5. The electric circuit as claimed in claim 2, the electric circuit further comprising:
   a third circuit, including at least one digital circuit, configured to operate with a third clock which is different in frequency from any of the first and second clocks, and wherein
   the third clock is higher in frequency than the second clock, and
   the synchronization detection circuit detects synchronization of the second clock with respect to the first clock or the third clock, whichever is lower in frequency.

6. The electric circuit as claimed in claim 2, the electric circuit further comprising:
   a fixed voltage source configured to apply a predetermined voltage to an input of the analog/digital converter; and
   an operation switching circuit configured to switch operation between a normal operation and a calibration data acquisition operation, and wherein
   with the operation switched to the calibration data acquisition operation by the operation switching circuit and with the predetermined voltage applied to the input of the analog/digital converter, the storage circuit stores the output noise pattern of the second circuit.

7. The electric circuit as claimed in claim 1, wherein
   the storage circuit stores the output noise pattern of the second circuit acquired over a period starting from the time that a first synchronization is detected by the synchronization detection circuit and lasting at least until the time that a subsequent second synchronization is detected.

8. The electric circuit as claimed in claim 7, wherein
   the synchronization detection circuit sets a synchronization detection signal active when a rising edge of the first clock and a rising edge of the second clock occur simultaneously within a predetermined noise sensitive time range of the analog/digital converter.

9. The electric circuit as claimed in claim 1, wherein the storage circuit comprises:
   a synchronous binary counter configured to be reset by a synchronous detection signal from the synchronous detection circuit, and count the second block; and
   a synchronous memory circuit configured to take an counter output signal from the synchronous binary counter as an address input, and latch the output noise pattern of the second circuit as a data input by the second clock.

10. The electric circuit as claimed in claim 1, wherein the storage circuit comprises:
    a synchronous binary counter configured to be reset by a synchronous detection signal from the synchronous detection circuit, and count the second block; and
    a synchronous associative memory circuit configured to take the output noise pattern of the second circuit as an address input, and latch an counter output signal from the synchronous binary counter as a data input by the second clock.

11. A signal processing method, comprising:
    operating a first circuit with a first clock;
    operating a second circuit with a second clock which is different in frequency from the first clock;
    detecting synchronization of the first and second clocks;
    storing an output noise pattern of the second circuit to a storage based on a result of the detecting synchronization; and
    correcting an output signal of the second circuit by using the output noise pattern.

12. The signal processing method as claimed in claim 11, wherein
    noise occurring in the second clock is reduced by a third circuit which operates with a third clock which is different in frequency from any of the first and second clocks.

13. The signal processing method as claimed in claim 12, the signal processing method further comprising:
    detecting synchronization of all of the first, second, and third clocks, and wherein
    the storing the output noise pattern of the second circuit is performed based on a result of the detecting synchronization.

14. The signal processing method as claimed in claim 12, the signal processing method further comprising:
    detecting synchronization of the second clock with respect to either one of the first and third clocks, and wherein
    the storing the output noise pattern of the second circuit is performed based on a result of the detecting synchronization.

15. The signal processing method as claimed in claim 14, wherein
    either one of the first and third clocks is the clock for driving the first circuit or the third circuit, whichever is the larger noise source.

16. The signal processing method as claimed in claim 12, the signal processing method further comprising:

detecting synchronization of the second clock with respect to the first clock or the third clock, whichever is lower in frequency, and wherein the storing the output noise pattern of the second circuit is performed based on a result of the detecting synchronization.

17. The signal processing method as claimed in claim 11, wherein the storing the output noise pattern of the second circuit stores the output noise pattern of the second circuit, with a predetermined voltage applied to an input of the second circuit.

18. The signal processing method as claimed in claim 11, wherein the storing the output noise pattern of the second circuit stores the output noise pattern of the second circuit acquired over a period starting from the time that a first synchronization is detected based on the result of the detecting synchronization and lasting at least until the time that a subsequent second synchronization is detected.

19. The signal processing method as claimed in claim 11, wherein the storing the output noise pattern of the second circuit sets a synchronization detection signal active when rising edges of the clocks whose synchronization is to be detected in the detecting synchronization occur simultaneously within a predetermined noise sensitive time range of the second circuit.

* * * * *